United States Patent
Tsui et al.

(10) Patent No.: US 6,309,942 B1
(45) Date of Patent: Oct. 30, 2001

(54) STI PUNCH-THROUGH DEFECTS AND STRESS REDUCTION BY HIGH TEMPERATURE OXIDE REFLOW PROCESS

(75) Inventors: Ting Y. Tsui, Palo Alto; Robert H. Tu, Sunnyvale; Xiao-Yu Li; Sunil D. Mehta, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/245,161

(22) Filed: Feb. 4, 1999

(51) Int. Cl.[7] .................................................. H01L 21/76
(52) U.S. Cl. .......................................... 438/400; 438/632
(58) Field of Search .................................. 438/400, 405, 438/433, 510, 618, 632, 279, 286, 620, 649, 682; 431/106, 131; 156/643, 648, 653, 656, 659, 662

(56) References Cited

U.S. PATENT DOCUMENTS

| | | | |
|---|---|---|---|
| 4,486,266 | * 12/1984 | Yamaguchi | 156/643 |
| 5,256,550 | * 10/1993 | Laderman et al. | 437/106 |
| 5,449,953 | * 9/1995 | Nathanson et al. | 257/728 |
| 5,712,185 | 1/1998 | Tsai et al. . | |
| 5,726,090 | 3/1998 | Jang et al. . | |
| 5,728,621 | 3/1998 | Zheng et al. . | |
| 5,731,611 | 3/1998 | Hshieh et al. . | |
| 5,747,377 | 5/1998 | Wu . | |
| 6,037,247 | * 3/2000 | Anand | 438/618 |
| 6,060,387 | * 5/2000 | Shepela et al. | 438/630 |
| 6,124,189 | * 9/2000 | Watanabe et al. | 438/586 |
| 6,147,000 | * 11/2000 | You et al. | 438/687 |
| 6,218,289 | * 4/2001 | Wu | 438/632 |

OTHER PUBLICATIONS

"Mechanical Stress Induced MOSFET Punch–through and Process Optimization for Deep Submicron TEOS–O3 filled STI Device", 1997 Symposium on VLSI Technology Digest of Technical Papers, K. Ishimaru, F. Matsuoka, M. Takahashi, M. Nishigohri., Y. Okayama, Y. Unno, M. Yabuki, K. Umezaza, N. Tsuchiya, O. Fujii and Y. M. Kinugawa, 2 Pages.

"Stress Minimization in Deep Sub–Micron Full CMOS Devices by Using an Optimized Combination of the Trench Filling CVD Oxides", M. H. Park, S. H. Hong, S. J. Hong, T. Park, S. Song, J. H. Park, H. S. Kim, Y. G. Shin, H. K. Kang and M. Y. Lee, 4 Pages.

"In–situ Measurement of Viscous Flow of Thermal Silicon Dioxide Thin Films at High Temperature", Chia–Liang Yu, Paul A. Flinn and John C. Bravman, 6 Pages.

* cited by examiner

Primary Examiner—David Nelms
Assistant Examiner—Phuc T. Dang
(74) Attorney, Agent, or Firm—Eschweiler & Associates, LLC

(57) ABSTRACT

A method of manufacturing a semiconductor device with reduced shallow trench isolation defects and stress is disclosed. The disclosed method begins by providing a silicon substrate including a capping layer. A plurality of isolation trenches are then etched through the capping layer and into the silicon substrate to form a plurality of isolation regions in the silicon substrate. The isolation trenches are then filled with an oxide layer. The oxide layer and the capping layer are then polished back using techniques known in the art. After polishing, the semiconductor device is annealed between a temperature range of about 1150° C. to about 1200° C.

23 Claims, 5 Drawing Sheets

STI PUNCH-THROUGH DEFECTS AND STRESS REDUCTION BY HIGH TEMPERATURE OXIDE REFLOW PROCESS

FIELD OF THE INVENTION

The present invention relates generally to transistors formed on a semiconductor device, and more particularly to a method of reducing punch-through defects and stress experienced by transistors through a high temperature oxide reflow process.

BACKGROUND OF THE INVENTION

Isolating devices that are fabricated on a semiconductor substrate is a significant aspect of modern semiconductor chip manufacturing. This is especially true in very-large-scale integration ("VLSI") and ultra-large-scale integration ("ULSI") semiconductor chips because hundreds of thousands of devices are fabricated in a single semiconductor chip. If two transistors or other devices are fabricated too close to one another, they will not work because they will be electrically shorted together. In addition, incorrect isolation among transistors can cause current leakage and further escalate latch-up that can impair proper functioning of the circuits on the semiconductor chip either momentarily or permanently.

In metal-oxide-semiconductor ("MOS") transistor fabrication, isolation is accomplished by forming isolation regions between neighboring active regions on the semiconductor chip. These isolation regions are formed by ion-doping a channel stop of polarity opposite to the source electrode and the drain electrode of the integrated circuit device, and by growing a thick oxide, commonly referred to as a field oxide. The channel stop and the thick oxide cause the threshold voltage in the isolation region to be much higher than those of the neighboring active devices.

One common approach in the semiconductor industry for forming isolation regions is by the localized oxidation of silicon ("LOCOS") method. LOCOS uses a patterned silicon nitride ("$Si_3N_4$") layer as an oxidation barrier mask and the silicon substrate is then selectively oxidized to form semi-planar isolation regions. The active devices are formed in the area defined by the silicon nitride layer. After oxidation, the silicon nitride layer is typically removed leaving a free area for the formation of the remaining circuit components.

An alternative to the LOCOS method of forming isolation regions is to use shallow trench isolation ("STI"). In this method, trenches are etched in the silicon substrate through microlithography techniques. The trenches are then filled using conventional deposition techniques with silicon dioxide, commonly some form of tetraethyl orthosilicate ("TEOS"). The silicon dioxide is then etched back or polished using chemical mechanical polishing ("CMP") to form the field oxide isolation regions.

As the active regions and the isolation regions in semiconductor devices have become more dense, it has been observed that a very small amount of transistors (approximately 5 out of 128,000) exhibit massive amounts of transistor leakage in some semiconductor chips. The transistor leakage experienced was not gate modulated so regular punch-through leakage was not the source of the transistor leakage. SEM micrographs of semiconductor chips that exhibit this transistor leakage have shown that the source and drain of the failed transistors were shorted by a punch-through killer defect in the channel of the failed transistors. While the source of this defect is not well understood, some references suggest that these defects may be stress related. Therefore, a need has arisen for a method of manufacturing a semiconductor chip that solves the problems associated with this defect in the channel of the failed transistors due to stress experienced during manufacturing.

SUMMARY OF THE INVENTION

The present invention provides a method of manufacturing a semiconductor device that reduces the number of punch-through killer defects that occur in transistors as a result of stress experienced during the manufacturing process. In the invention, the semiconductor device being manufactured is annealed at a temperature in excess of 1150° C. The method of manufacturing semiconductor devices begins by depositing a capping layer on the surface of a silicon substrate. After the capping layer is deposited, a plurality of isolation trenches are etched through the capping layer into the silicon substrate. Each respective isolation trench is then filled with an oxide layer using conventional deposition techniques known in the art. Once the isolation trenches have been filled, the oxide layer and the capping layer are polished back using conventional polishing techniques known in the art, such as CMP. The resulting device is then annealed between the temperatures of about 1150° C. to about 1200° C.

Annealing the semiconductor device at temperatures in excess of about 1150° C. relieves the strain associated with the shrinkage of the oxide layer that is deposited to fill the trenches of the semiconductor device. Silicon dioxide's glass transition temperature is near 1000° C., and it can undergo stress relaxation by viscous flow at temperatures above its glass transition temperature. If the semiconductor device is annealed at a high enough temperature, such that the viscous flow stress relief is greater than the stress generated from the annealing, the punch-through killer defects in the active area of the semiconductor device may be greatly reduced.

The method of the invention reduces the punch-through killer defects by decreasing the stress experienced by the active regions of transistors located on the semiconductor device. The volume shrinkage of the isolation regions of the transistors fabricated on the semiconductor device during the post CMP high temperature densification process can generate more than 5% strain. This strain creates a large amount of Von Mises Stress in the active regions and punch-through killer defects may occur in the active areas as a result of this stress. In order to relieve this stress, a high temperature oxide reflow process is used as one of the steps after STI formation in the process of manufacturing the semiconductor device. According to the process of the invention, the annealing temperature is increased from about 1000° C. to about 1150° C.–1200° C.

These and other features and advantages of the invention will become apparent upon consideration of the following detailed description of the presently preferred embodiments of the invention, viewed in conjunction with the appended drawings.

DETAILED DESCRIPTION OF THE PREFERRED EMBODIMENTS OF THE PRESENT INVENTION

Figure 1:
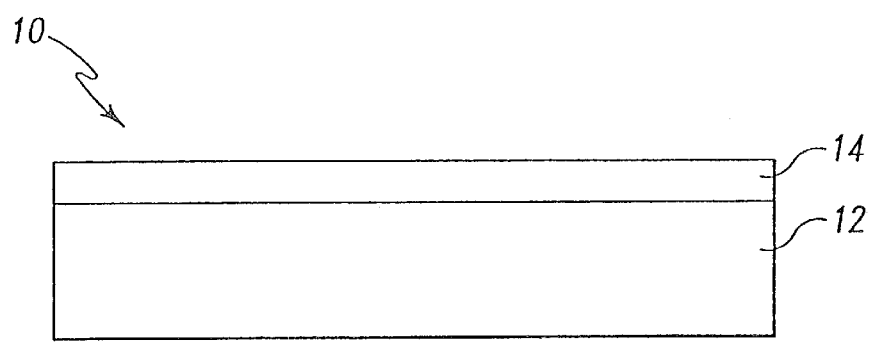
FIG. 1 depicts a cross-section of a small portion of a semiconductor device including a silicon substrate and a capping layer.

Referring to FIG. 1, the present invention comprises a method of manufacturing a semiconductor device 10 with a reduced likelihood of having punch-through killer defects in the active regions of numerous transistors (not shown) located on the semiconductor device 10. The semiconductor device 10 includes a silicon substrate 12 that has a capping layer 14 deposited on the surface of the silicon substrate 12 using conventional deposition techniques. The preferred material used for the capping layer 14 is silicon nitride.

Figure 2:
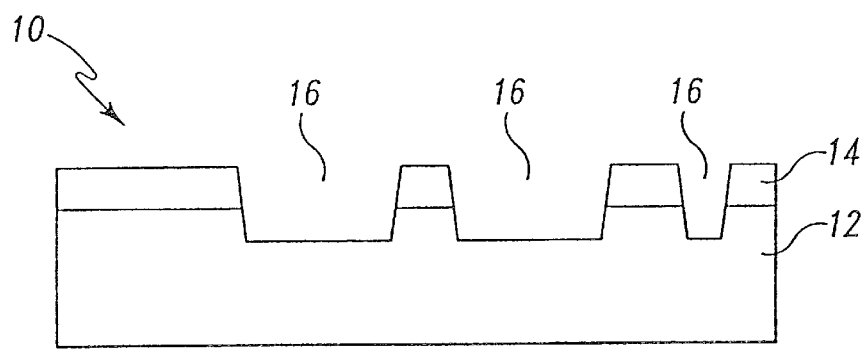
FIG. 2 depicts the semiconductor device depicted in FIG. 1 including trenches etched into the silicon substrate and capping layer.

Referring to FIG. 2, after the capping layer 14 is deposited, the semiconductor device 10 is etched to form a plurality of patterned isolation trenches 16 in the silicon substrate 12. The preferred depth of the isolation trenches 16 is about 4000 angstroms. The semiconductor device 10 may be etched using conventional etching techniques known in the semiconductor industry. In general, in order to etch the isolation trenches 16 through the capping layer 14 and into the silicon substrate 12 microlithography must be used to transfer the desired pattern of the isolation trenches 16 onto the surface of the semiconductor device 10. Those skilled in the art would recognize that several variations exist on the exact process of etching that are beyond the scope of the present disclosure.

Figure 3:
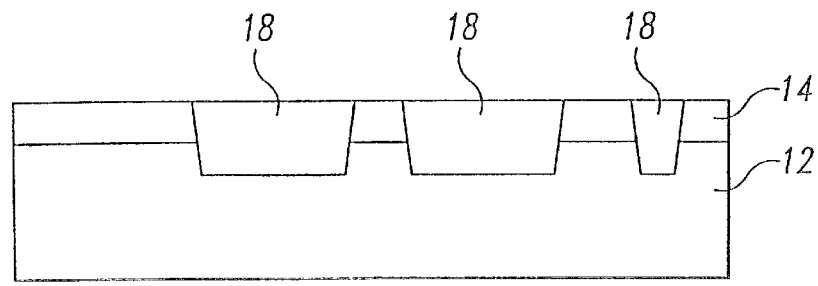
FIG. 3 depicts the semiconductor device depicted in FIG. 2 after deposition of an oxide layer that fills the trenches.

Once the isolation trenches 16 have been etched, an oxide layer 18 is deposited on the surface of the semiconductor device 10, which fills the newly created isolation trenches 16, as shown in FIG. 3. The oxide layer 18 may be deposited on the semiconductor device 10 using one of several deposition techniques known in the semiconductor industry, such as chemical vapor deposition ("CVD"). The oxide layer 18 may be selected from one of several dielectric materials used in the semiconductor industry. However, the preferred material for the oxide layer 18 is TEOS.

After the oxide layer 18 is deposited, the semiconductor device 10 is polished back using a polishing technique known in the art, such as CMP. CMP is a wafer flattening and polishing process that combines chemical removal with mechanical buffering. The reason that CMP is the preferred method of polishing back the semiconductor device 10 is that CMP is capable of providing a global planarization of the entire surface of the semiconductor device 10.

Figure 4:
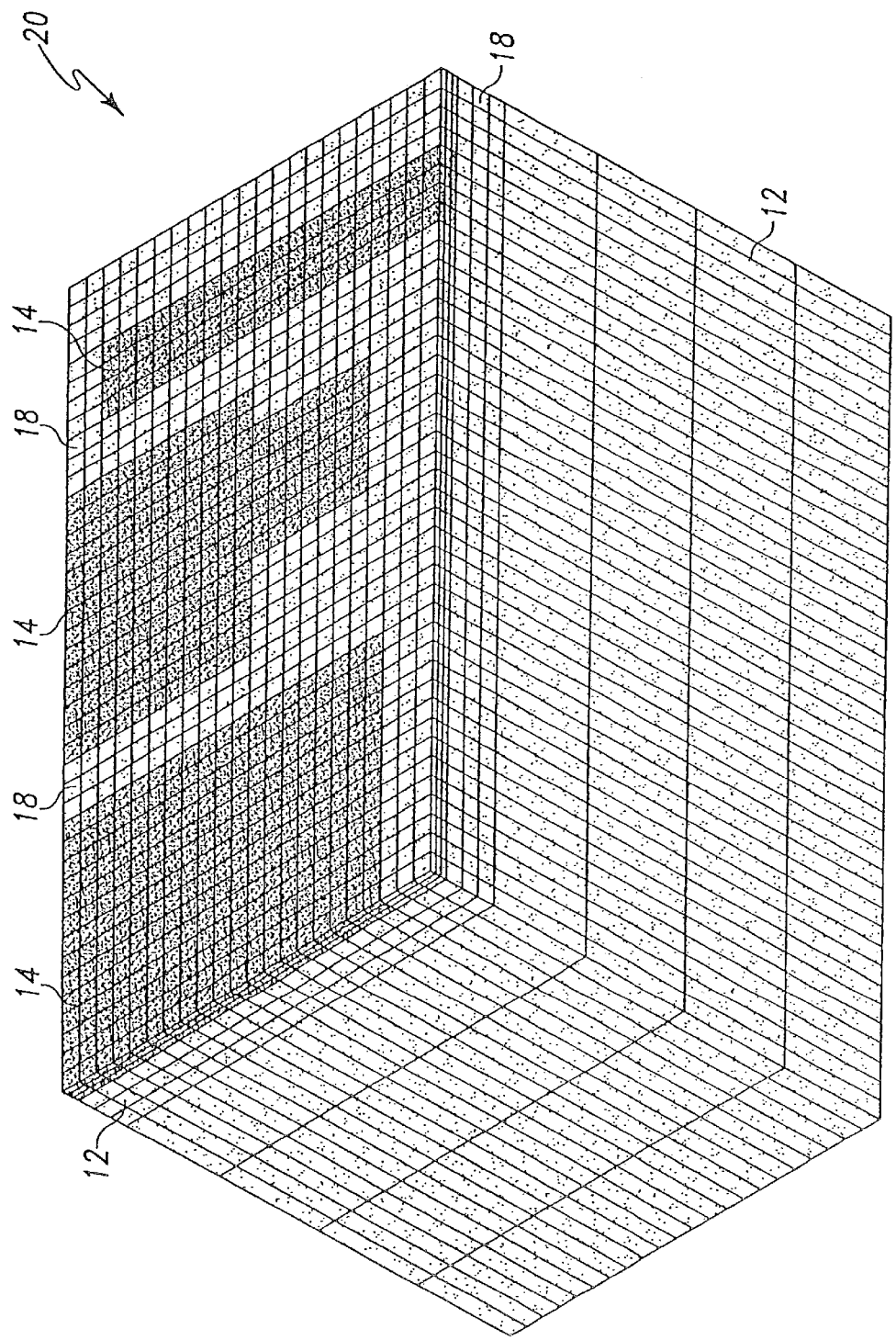
FIG. 4 is a three-dimensional depiction of a cross-section of a transistor formed on a semiconductor device.

Referring to FIG. 4, those skilled in the art would recognize that the result of the above-mentioned steps is the creation of a transistor 20 on a small portion of the semiconductor device 10. The transistor 20 includes a capping layer 14 and an oxide layer 18 that fills the isolation trenches 16. Although only one transistor 20 is illustrated in FIG. 4, those skilled in the art would recognize that hundreds of thousands of transistors can be created on a single semiconductor device 10. The above-mentioned steps should not be interpreted as a limitation of the present invention and should be viewed as an example of how a plurality of transistors 20 are created on semiconductor devices 10 using shallow trench isolation ("STI") techniques. The exact layout of the transistor 20 will vary in different semiconductor devices 20.

After the semiconductor device 10 is polished using a conventional polishing process, the semiconductor device 10 is annealed. More specifically, the semiconductor device 10 is annealed, preferably, between the temperatures of about 1150° C. to about 1200° C.; however, the temperature may be taken above 1200° C. Heating the semiconductor device 10 to these temperatures causes the oxide layer 18 to reach its glass transition temperature, which relieves the stress the silicon substrate 12 experiences by the shrinking of the oxide layer 18 during the annealing procedure.

As known in the art, annealing is a high-temperature processing step, which is designed to minimize stress in the crystal structure of the semiconductor device 10. In addition, annealing can be used to restore crystal damage that might have occurred during manufacturing and is also used to electrically activate various dopants that may have been deposited during fabrication. Prior known annealing practices took place between the temperature range of 600° C.–1000° C.

As previously set forth, annealing the semiconductor device 10 between the temperatures of about 1150° C. to about 1200° C. relieves the strain associated with shrinkage of the oxide layer 18. The stress values caused by shrinkage of the oxide layer 18 with respect to the silicon substrate 12 are the highest directly beneath the oxide layer 18. However, since there are typically no active devices located at these locations in the silicon substrate 10, the stress at these locations is not a major concern.

Figure 5:
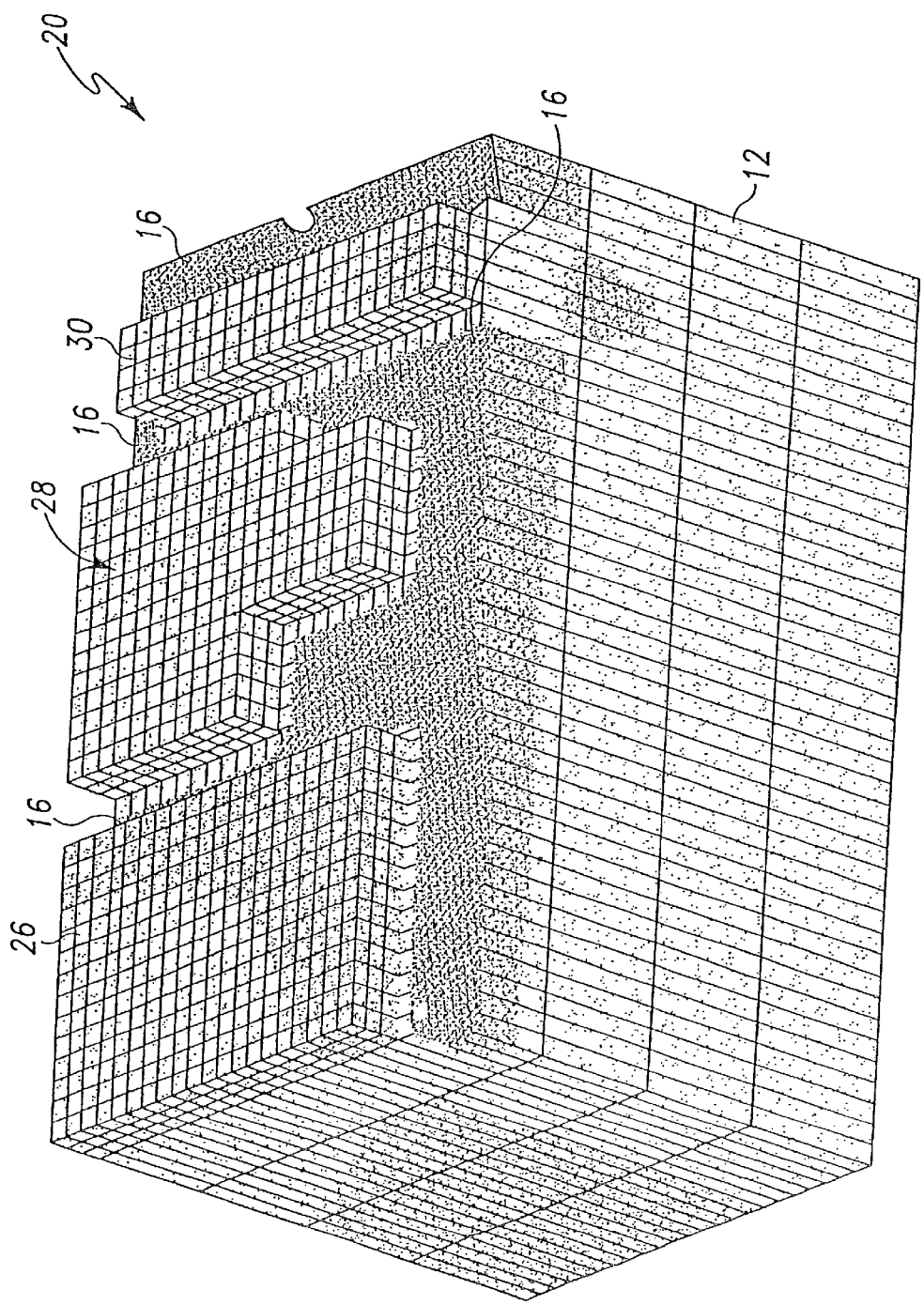
FIG. 5 is a three-dimensional depiction of a cross-section of a transistor formed on a semiconductor device.

Referring to FIG. 5, which illustrates the transistor 20 with the oxide layer 18 removed from the isolation trenches 16, the capping layer 14 creates a first active region 26, a second active region 28 and a third active region 30 above the silicon substrate 12. This is a result of the etching process, which forms the patterned isolation trenches 16. The actual failure site of the transistors 20 that experience punch-through killer defects is usually in the third active region 30. The stress values caused by shrinkage of the oxide layer 18 during annealing can also be high in the second region 28 of the transistor 20.

The aspect ratio of the oxide layer 18 that has been deposited has an effect on the Von Mises Equivalent stress experienced in the silicon substrate 12 beneath the first active region 26, the second active region 28 and the third region 30. Aspect ratio is a term used in the semiconductor industry to describe the relationship between the width and height of isolation trenches 16 and the ability of the oxide layer 18 to uniformly fill the isolation trenches 16. The highest stress region in the semiconductor device 10 is located near the top surface of the silicon substrate 12 and its value increases as the nearby isolation trench aspect ratio increases. In general, transistors 20 with deeper isolation trenches 16 nearby will experience larger amounts of stress than transistors 20 with shallow isolation trenches 16. In addition, transistors 20 with isolation trenches 16 that have a smaller active width will experience a larger amount of stress than transistors 20 with isolation trenches 16 that have a larger active width.

Another important consideration when fabricating the transistor 20 is the thickness of the capping layer 14 that is deposited on the silicon substrate 12. The Von Mises Equivalent stress experienced by active regions of the silicon substrate 12 below the capping layer 14 decreases with the thickness of the capping layer 14. As such, the thinner the capping layer 14, the more stress the active regions of the silicon substrate 12 beneath the capping layer 14 will experience. One explanation for lower stress in the active areas of the silicon substrate 12 with a thicker capping layer 14 may be due to more displacement constraint from the thicker capping layer 14.

The effects of thermal strain as opposed to anneal strain are also important. Oxide layer 18 shrinkage after annealing can generate thermal strain in the range of about 3.8%–10%. These strain values after annealing correspond to tensile stress values in the range of 2.8 GPa–7 GPa, while the tensile yield strength of silicon is about 6 GPa. Both thermal strain and annealing strain cause the highest amounts of stress in regions near the active corners of the silicon substrate 12. The stress values associated with the annealing process are about 100 times higher than the stress values created without the anneal strain. Therefore, the shrinkage generated during the high temperature annealing process is the most important factor in developing the Von Mises Equivalent stress that causes punch-through killer defects in the active regions of the transistors 20.

Figure 6:
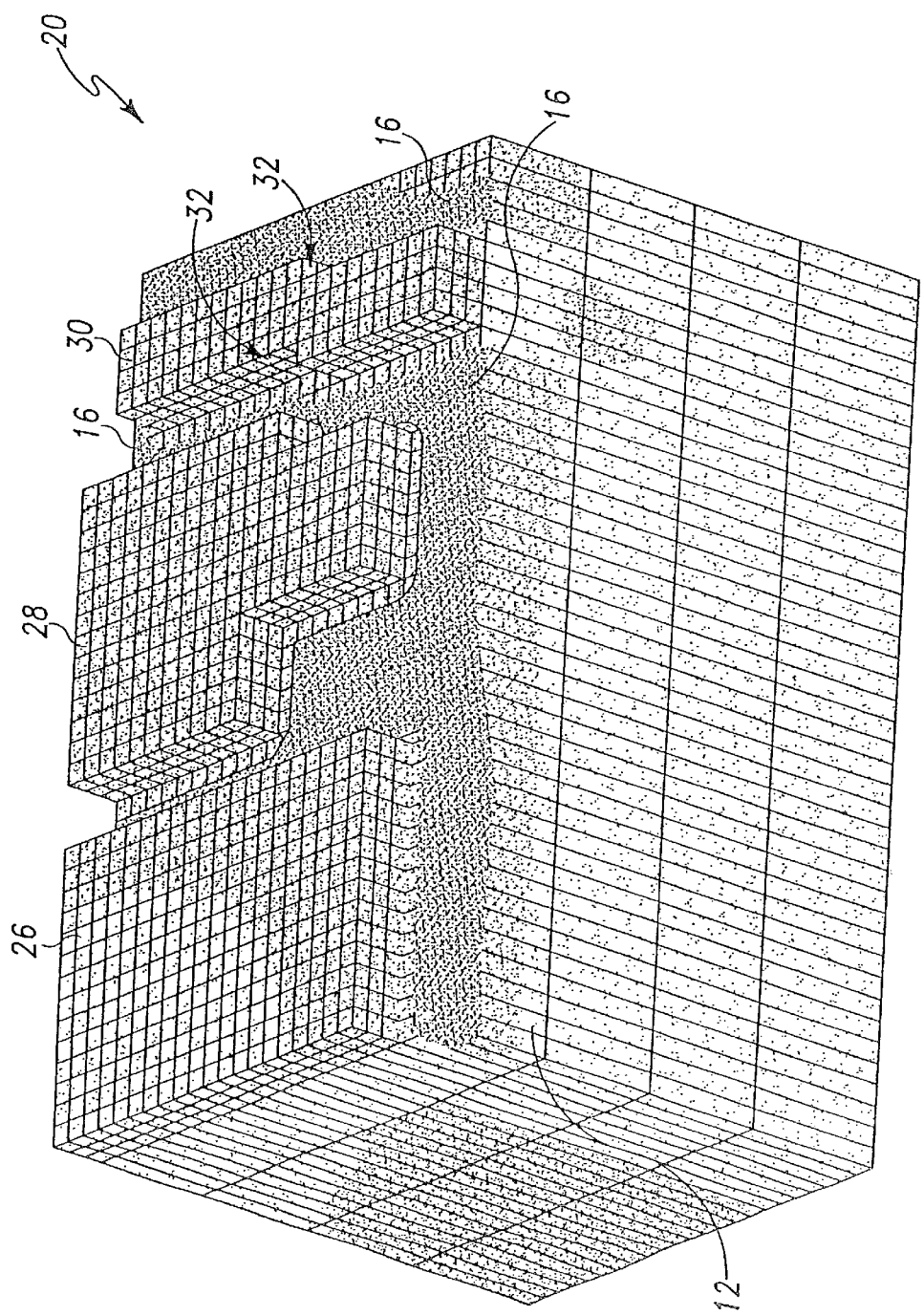
FIG. 6 is a three-dimensional depiction of a cross-section of a transistor formed on a semiconductor device with a jog.

Referring to FIG. 6, another concern with the Von Mises Equivalent stress that the transistors 20 experience is the effect of a 0.2 $\mu$m jog 32 in the third active region 30. As previously stated, the silicon substrate 12 beneath the third active region 30 is where a majority of the punch-through killer defects have been observed in studies on semiconductor devices 10 containing defective transistors 20. In general, an increase in the stress caused to the silicon substrate 12 beneath the third active region 30 was observed at the jog 32. The stress caused by the jog 32 is dependent on the geometry of the jog 32. In addition, sharp corners created by the jog 32 cause higher amounts of stress.

Figure 7:
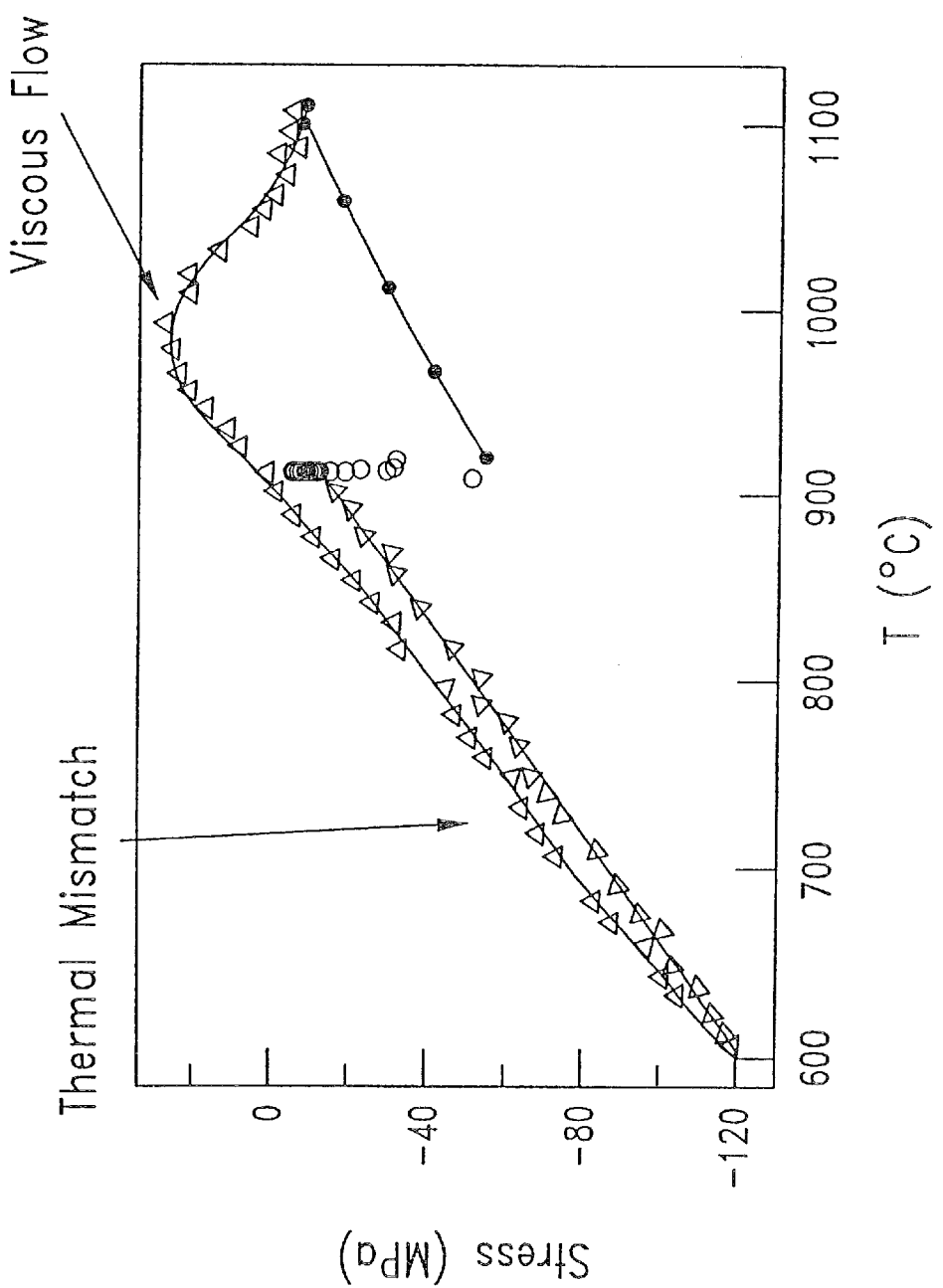
FIG. 7 is a graph of the effects of temperature on the oxide layer of the semiconductor device.

As previously stated, the present invention is directed to annealing the semiconductor device 10 at temperatures in excess of about 1150° C., preferably between 1150° C.–1200° C. Annealing between this temperature range relieves the strain associated with shrinkage of the oxide layer 18 during the annealing step. Fortunately, the materials used in the oxide layer 18, TEOS or other such forms of silicon dioxide, have glass transition temperatures near 1000° C. As indicated in FIG. 7, the oxide layer 18 can undergo stress relaxation by viscous flow at temperatures above the oxide's glass transition temperature. If the semiconductor device is annealed at a high enough temperature, such that the viscous flow stress relief is greater than the stress generated from the annealing, the punch-through killer defects in the active areas of the silicon substrate 12 are substantially reduced. As indicated by the graph, the only stress that remains in the device at room temperature will be from the thermal mismatch of the silicon and silicon dioxide during cooling.

While the invention has been described in its currently best known modes of operation and embodiments, other modes and embodiments of the invention will be apparent to those skilled in the art and it is the following claims, including all equivalents, that are intended to define the spirit and scope of the invention.

What is claimed is:

1. A method of manufacturing a semiconductor device, comprising the steps of:
   providing a silicon substrate having at least one transistor formed with a plurality of patterned isolation regions and a capping layer, wherein the patterned isolation regions are filled with a dielectric material; and
   annealing the semiconductor device at a temperature in excess of about 1150° C.

2. The method of claim 1, wherein the plurality of patterned isolation regions are formed as shallow trench isolation regions in the silicon substrate.

3. The method of claim 1, wherein the plurality of isolation regions are etched to a depth of about 4000 angstroms in the silicon substrate.

4. The method of claim 1, wherein the dielectric material is tetraethyl orthosilicate.

5. The method of claim 1, wherein at least one of the patterned isolation regions includes a jog.

6. The method of claim 1, wherein the capping layer comprises silicon nitride.

7. A method of manufacturing a semiconductor device, comprising the step of:
   providing a silicon substrate having a capping layer;
   etching a plurality of isolation trenches in the silicon substrate, wherein the trenches are filled with an oxide layer; and
   annealing the semiconductor device between the temperature range of about 1150° C. to about 1200° C.

8. The method of claim 7, wherein the trenches are formed to a depth of about 4000 angstroms in the silicon substrate.

9. The method of claim 7, wherein the oxide layer comprises tetraethyl orthosilicate.

10. The method of claim 7, wherein the capping layer comprises silicon nitride.

11. A method of manufacturing a semiconductor device, comprising the step of:
    providing a silicon substrate including a capping layer;
    etching a plurality of isolation trenches through the capping layer and into the silicon substrate to form plurality of isolation regions in the silicon substrate;
    filling the isolation trenches with an oxide layer;
    polishing back the oxide layer and the capping layer; and
    annealing the semiconductor device at a temperature in the range of 1150° C.–1200° C.

12. The method of claim 11, wherein the capping layer comprises silicon nitride.

13. The method of claim 11, wherein the plurality of isolation regions are etched to a depth of about 4000 angstroms in the silicon substrate.

14. The method of claim 11, wherein the oxide layer comprises tetraethyl orthosilicate.

15. The method of claim 7, wherein at least one of said isolation trenches includes a jog.

16. The method of claim 11, wherein at least one of said isolation trenches includes a jog.

17. A method of manufacturing isolation regions in a semiconductor device, comprising the steps of:
    providing a silicon substrate having at least one transistor formed with a plurality of patterned isolation regions and a capping layer, wherein said plurality of patterned isolation regions are filled with tetraethyl orthosilicate; and
    annealing the semiconductor device at a temperature in excess of about 1150° C.

18. A method of manufacturing isolation regions in a semiconductor device, comprising the steps of:
    providing a silicon substrate having at least one transistor formed with a plurality of patterned isolation regions and a capping layer, wherein at least one of the patterned isolation regions includes a jog; and
    annealing the semiconductor device at a temperature in excess of about 1150° C.

19. A method of manufacturing a semiconductor device, comprising the steps of:
    providing a silicon substrate having a capping layer;
    etching a plurality of isolation trenches in the silicon substrate, wherein the isolation trenches are filled with tetraethyl orthosilicate; and annealing the semiconductor device between the temperature range of about 1150° C. to about 1200° C.

20. The method of claim 19, wherein at least one of said plurality of isolation trenches includes ajog.

21. A method of manufacturing a semiconductor device, comprising the steps of:

provuing a silicon substrate including a capping layer;

etching a plurality of isolation trenches through the capping layer and into the silicon substrate to form plurality of isolation regions in the silicon substrate;

filling the isolation trenches with tetraethyl orthosilicate;

polishing back the oxide layer and the capping layer; and annealing the semiconductor device at a temperature in the range of 1150° C.–1200° C.

22. A method of manufacturing a semiconductor device, comprising the steps of:

providing a silicon substrate having a capping layer;

etching a plurality of isolation trenches in the silicon substrate, wherein the isolation trenches are filled with an oxide layer; and annealing the semiconductor device at a temperature equal to the glass transition temperature of the oxide layer.

23. A method of manufacturing a semiconductor device, comprising the steps of:

providing a silicon substrate having a capping layer;

etching a plurality of isolation trenches in the silicon substrate, wherein the isolation trenches are filled with an oxide layer; and annealing the semiconductor device at a temperature equal to or greater than the glass transition temperature of the oxide layer.

* * * * *